United States Patent [19]
Tanaka et al.

[11] Patent Number: 5,909,036
[45] Date of Patent: Jun. 1, 1999

[54] GROUP III-V NITRIDE SEMICONDUCTOR DEVICE

[75] Inventors: Motoyuki Tanaka, Amagasaki; Kouichi Sogabe, Itami, both of Japan

[73] Assignee: Sumitomo Electric Industries, Ltd., Osaka, Japan

[21] Appl. No.: 08/881,126

[22] Filed: Jun. 24, 1997

[30] Foreign Application Priority Data

Jun. 25, 1996 [JP] Japan ..................................... 8-163974
May 9, 1997 [JP] Japan ..................................... 9-119515

[51] Int. Cl.$^6$ ..................................................... H01L 33/00
[52] U.S. Cl. ............................ 257/94; 257/103; 257/628
[58] Field of Search .............................. 257/94, 96, 103, 257/627, 628, 13, 615; 372/43

[56] References Cited

U.S. PATENT DOCUMENTS 3,565,704  2/1971  Chu et al. ................................. 148/174
5,693,963  12/1997  Fujimoto et al. ......................... 257/103

FOREIGN PATENT DOCUMENTS 08116092  5/1996  European Pat. Off. .
09186404  7/1997  European Pat. Off. .
64-42813  2/1989  Japan .

OTHER PUBLICATIONS

Akasaki, Isamu, et al, "Stimulated Emission by Current Injection from an AlGaN/GaN/GaInN Quantum Well Device," *Appl. Phys. Lett.*, vol. 34 (1995), pp. L1517–L1519.

Kurai, Satoshi, et al, "Photopumped Stimulated Emission from Homoepitaxial GaN Grown on Bulk GaN Prepared by Sublimation Method, " *Jpn. J. Appl. Phys.*, vol. 35 (1996), pp. L77–L79.

Nakamura, Shuji, et al, "InGaN–Based Multi–Quantum–Well–Structure Laser Diodes," *Jpn. J. Appl. Phys.*, vol. 35 (1996), pp. L74–L76.

Nakamura, Shuji, et al, "InGaN Multi–Quantum–Well Structure Laser Diodes Grown on MgAl$^2$O$^4$ Substrates," *Appl. Phys. Lett.*, vol. 68, No. 15 (1996), pp. 2105–2107.

Nakamura, Shuji, et al, "InGaN Multi–Quantum–Well–Structure Laser Diodes With Cleaved Mirror Cavity Facets," *Jpn. J. Appl. Phys.*, vol. 35 (1996), pp. L217–L220.

Nakamura, Shuji, et al, "Room–Temperature Continuous–Wave Operation of InGaN Multi–Quantum–Well Structure Laser Diodes," *Appl. Phys. Lett.*, vol. 69, No. 26, (1996), pp. 4056–4058.

*Primary Examiner*—Minh Loan Tran
*Attorney, Agent, or Firm*—McDermott, Will & Emery

[57] ABSTRACT

A semiconductor device comprising single crystal films consisting of at least one III-V nitride selected from the group consisting of gallium nitride, aluminum nitride, boron nitride, indium nitride, and single-crystalline alloys of these nitrides, the single crystal films being provided on a single crystal substrate of aluminum nitride either directly or through a low-temperature growth buffer layer of at least one III-V nitride. This semiconductor device is useful as a short-wavelength light emitting device capable of conducting continuous oscillation or a diode which is operated at a high temperature. The AlN single crystal substrate is matched in lattice constant and coefficient of thermal expansion with the single crystal film of a III-V nitride and the single crystal films is grown with good crystallinity on the substrate.

28 Claims, 4 Drawing Sheets

GROUP III-V NITRIDE SEMICONDUCTOR DEVICE

BACKGROUND OF THE INVENTION

1. Field of the Invention

The present invention relates to semiconductor devices using a III-group element nitride (hereinafter, III-V nitride) for use in, for example, a reader of a high-density optical disk, including short-wavelength light emitting devices, such as a light emitting diode or a laser diode, light-receiving devices such as a photodiode, high-temperature semiconductor devices which can operate even in a high-temperature environment, and high-speed operation semiconductor devices.

2. Description of the Prior Art

A III-V nitride having a wurtzite structure is a direct transition type semiconductor having a wide forbidden band and, hence, has attracted attention as a material for a short-wavelength light emitting device or a light-receiving device and, further, a high-temperature semiconductor device and a high-speed semiconductor device. The III-V nitrides having the above wurtzite structure include gallium nitride (GaN), aluminum nitride (AlN), boron nitride (BN), indium nitride (InN), and single-crystalline alloys of these nitrides. The forbidden band width can be varied by varying the type of the material and the composition of the single-crystalline alloy.

In particular, gallium nitride and single-crystalline alloys thereof have been actively studied as the material of light emitting devices. In recent years, blue and bluish green LEDs (light emitting diodes) using a gallium nitride compound semiconductor have been put to practical use, and, in the next stage, practical use of short-wavelength LDs (laser diodes) in a reader for a high-density optical disk is expected in the art.

In the formation of semiconductor devices such as LEDs and LDs, a single crystal film of a semiconductor should be grown on a substrate of a single crystal of the same crystal structure. In the III-V nitrides, however, a single crystal having a size large enough to be used as the substrate could have not been synthesized, and, hence, hetero-epitaxial growth wherein a single crystal film of a III-V nitride is grown on a dissimilar substrate has been used in the art. Substrates known to be usable for the hetero-epitaxial growth include the (0001) plane (plane C) and the (11-20) plane (plane A) of a single crystal of sapphire, the (111) plane of a single crystal of silicon, the (0001) plane of a single crystal of 6H-SiC, and the (111) plane of a single crystal of $MgAl_2O_4$.

The single crystal substrate of sapphire among these substrates permits the growth of a single crystal film of a gallium nitride compound semiconductor having good crystallinity through a low-temperature growth buffer layer and, in addition, is relatively inexpensive. Therefore, it is most commonly used in blue and bluish green LEDs utilizing the above gallium nitride compound semiconductor.

Particularly regarding LDs, however, those in an infrared region using a GaAs compound semiconductor or an InP compound semiconductor have been put to practical use, but blue-emitting LDs using a III-V nitride are still under study and there are some reports thereon. Examples of such reports include Jpn. J. Appl. Phys., Vol. 35 (1996), pp. L74–L76, Jpn. J. Appl. Phys., Vol. 35 (1996), pp. L217–L220, and Appl. Phys. Lett., Vol. 68, No. 15 (1996), pp. 2105–2107. All the LDs cited in these reports are of a pulse oscillation type.

Appl. Phys. Lett., Vol. 69, No. 26 (1996), pp. 4056–4058 reports a continuous oscillation type LD. This LD has a short service life due to a temperature rise during continuous oscillation. This is because, since the single crystal substrate is not constituted of a III-V nitride, the differences in the lattice constant and in the coefficient of thermal expansion between the substrate and the overlying single crystal film of a III-V nitride are so large that it is difficult to synthesize a single crystal film of a III-V nitride having good crystallinity, which results in inclusion of many defects such as dislocation in the single crystal film.

Thus, high-temperature semiconductor devices and high-speed semiconductor devices using III-V nitrides have not been yet put to practical use, although application of III-V nitrides as a light emitting device has been partly realized. This also is because many defects such as dislocation are included in the single crystal film of a III-V nitride. The dislocation is propagated under high temperature conditions, leading to remarkably deteriorated performance, which results in a shortened service life. Further, the dislocation lowers the mobility of the carrier unfavorably, making it impossible to realize high-speed operation.

For this reason, improving the film quality by interposing a low-temperature buffer layer has been attempted. At the present time, however, the improvement is unsatisfactory. In addition, the cleavage of the single crystal substrate used is difficult, posing problems that the flatness of the mirror facet for a laser cavity cannot be ensured in the formation of LD and, in addition, the step of forming the mirror facet for a laser cavity is complicate.

In order to solve the above problems, an attempt to utilize a single crystal of gallium nitride as a III-V nitride for a single crystal substrate has been reported in Jpn. J. Appl. Phys., Vol. 35 (1996), pp. L77–L79. The size of the single crystal of gallium nitride which can be currently synthesized is small and up to about 2 mm square, making it difficult to put the single crystal to practical use in semiconductor devices such as LDs which can be continuously oscillated.

Further, heat dissipation should be improved because light emitting devices, particularly LDs, have a high calorific value at the time of light emission, high-speed semiconductor devices have a high calorific value at the time of high-speed operation, and, further, high-temperature semiconductor devices also need the prevention of deterioration thereof. For these reasons, the use of substrates having high heat conductivity is desired. In this connection, however, it should be noted that all of substrates made of sapphire, silicon, $MgAl_2O_4$, and the like, which permit the crystal growth of a necessary single crystal film, have low heat conductivity. Therefore, in devices where high output and temperature stability are required, these substrates are used in the form bonded to a heat sink material. Jpn. J. Appl. Phys., Vol. 34 (1995), pp. L1517–1519 proposes a device comprising a single crystal substrate of sapphire and a GaN layer provided on the substrate through an AlN film. In this device, however, the above problem of heat dissipation remains unsolved because the single crystal of sapphire is used as the substrate.

An example of the growth of a semiconductor material on a substrate having high heat conductivity is described in Japanese Patent Laid-Open No. 42813/1989 wherein a single crystal film of a semiconductor is provided on a single crystal substrate of diamond. The substrate in this example is a thin-film single crystal substrate comprising a single crystal substrate of diamond bearing at least one single crystal layer formed of at least one material selected from among gallium nitride, indium nitride, aluminum nitride and the like. This example is aimed at providing a substrate having high heat conductivity, low coefficient of thermal expansion, and excellent heat resistance and environmental resistance. This single crystal substrate of diamond also is unsatisfactory in matching in lattice constant and coefficient of thermal expansion with the single crystal of a III-V nitride.

As described above, substrate materials, such as sapphire, silicon, SiC, and $MgAl_2O_4$, which have hitherto been used for the growth of a single crystal film of a III-V nitride are unsatisfactory in matching in lattice constant and coefficient of thermal expansion with the III-V nitride. This makes it difficult to synthesize a single crystal film of a III-V nitride having good crystallinity on these substrates, and, at the present time, the interposition of a low-temperature growth buffer layer between the single crystal film and the substrate is necessary and indispensable.

For all the conventional single crystal substrates except for SiC, the cleavage for the formation of a mirror facet for a laser cavity in LDs was impossible. Although an attempt has been made to form a mirror facet by etching, this method cannot provide a satisfactorily even laser cavity and, at the same time, is disadvantageous in that the step of forming a mirror facet is complicate. On the other hand, the use of SiC as the substrate results in poor light emitting properties. Although the reason for the poor light emitting properties has not been elucidated yet, it is believed to reside in the stress derived from the difference in the coefficient of thermal expansion or diffusion of the SiC component in the GaN film. For the sapphire substrate which has been most commonly used in the art, the heat conductivity is so low that, for use in light emitting devices, the substrate should be bonded to a heat sink. Further, in this case, since sapphire is not electrically conductive, it is difficult to handle an electrode in the bonding to the heat sink.

As described in Jpn. J. Appl. Phys., Vol. 35 (1996), pp. L77–L79, the use of a single crystal substrate of gallium nitride enables the synthesis of a high-quality film of a III-V nitride. At the present time, the formation of a large single crystal of gallium nitride to be used as the substrate is difficult, and, in addition, the thermal conductivity is poor, offering poor heat dissipation. In the technique disclosed in the Japanese Patent Laid-Open No. 42813/1989, a single crystal substrate of diamond having high thermal conductivity is used for heat dissipation purposes. This method is, however, disadvantageous in that this substrate is unsatisfactory in matching in lattice constant and coefficient of thermal expansion with the single crystal of a III-V nitride.

SUMMARY OF THE INVENTION

Under the above circumstances, an object of the present invention is to grow a single crystal film of a III-V nitride having good crystallinity on a substrate having good matching in lattice constant and coefficient of thermal expansion with a III-V nitride, particularly on a substrate having a cleavage surface and good thermal conductivity and capable of offering a relatively large single crystal, thereby providing semiconductor devices using a III-V nitride, such as short-wavelength light emitting devices capable of conducting continuous oscillation, light receiving devices, high-temperature semiconductor devices, and high-speed semiconductor devices.

According to the present invention, the above object can be attained by a semiconductor device comprising a single crystal substrate of aluminum nitride and a single crystal film of at least one III-V nitride provided on the substrate, wherein the at least one III-V nitride of the single crystal film is selected from the group consisting of gallium nitride, aluminum nitride, boron nitride, indium nitride, and single-crystalline alloys of these compounds.

The single crystal film may be formed onto the aluminum nitride single crystal substrate either directly or through a low-temperature growth buffer layer consisting of at least one III-V nitride selected from the group consisting of gallium nitride, aluminum nitride, boron nitride, indium nitride, and single-crystalline alloys of these compounds.

Semiconductor devices referred to in the present invention include light emitting devices, light receiving devices, high-temperature semiconductor devices, and high-speed semiconductor devices, and examples of the light emitting devices include light emitting diodes (LEDs) and laser diodes (LDs). In particular, in the case of LDs, the mirror facet for a laser cavity can be formed by the cleavage of a single crystal substrate of aluminum nitride and a single crystal film of a III-V nitride. In this case, the (10-10) or (11-20) plane of a single crystal film of a III-V nitride is utilized as the cleavage surface, and, for this purpose, the (0001) plane of a single crystal of aluminum nitride is used as the substrate. Alternatively, the (0001) plane of the single crystal film of a III-V nitride may be utilized as the cleavage surface, and, for this purpose, the (10-10) or (11-20) plane of the single crystal of aluminum nitride may be advantageously used as the substrate.

In the present invention using a single crystal of aluminum nitride as the substrate, it is also possible to construct a semiconductor device in such a manner that the provision of a low-temperature growth buffer layer of a III-V nitride, which has been necessary for growing a single crystal film of a III-V nitride having excellent crystallinity and smooth film surface, is omitted and a single crystal film of a III-V nitride film is formed directly on a single crystal substrate of aluminum nitride.

DETAILED DESCRIPTION OF THE PREFERRED EMBODIMENTS

According to the present invention, a III-V nitride is grown on a single crystal substrate of aluminum nitride (AlN), which has lattice constant and coefficient of thermal expansion close to those of the III-V nitride and good thermal conductivity and can be produced in a relatively large single crystal form, to form a single crystal film having excellent crystallinity, thereby realizing semiconductor devices such as light emitting devices suitable for light emission at short wavelengths.

In order to realize a semiconductor device such as a light emitting device, it is generally necessary to use a single crystal substrate having a size large enough to reduce the production cost. The single crystal of a III-V nitride does not naturally occur and should be artificially synthesized, and single crystals of boron nitride, gallium nitride, and aluminum nitride have hitherto been artificially synthesized. Among them, a single crystal of aluminum nitride can be stably and inexpensively synthesized in a relatively large size, rendering this single crystal suitable for use as a substrate in the formation of a semiconductor device.

The present inventors have proposed in Japanese Patent Application No. 141236/1996 a process for preparing a single crystal of a nitride having a larger size and a higher quality. This process comprises mixing a powder of a nitride, such as AlN, with a powder of an oxide which can be reacted with the nitride under heating to decompose and vaporize the nitride, and heating the mixed powders in a nitrogen atmosphere optionally containing hydrogen and/or carbon at a temperature below the sublimation temperature or melting temperature of the nitride to permit the nitride powder to be reacted with the oxide powder, thereby decomposing and vaporizing the nitride powder and permitting the decomposed and vaporized component to be grown from a vapor phase on the substrate to provide a nitride such as AlN.

According to this process, a single crystal of aluminum nitride having a size sufficient for practical use as a bulk material, specifically a single crystal of aluminum nitride of not less than 10 mm in both length and width and not less than 300 $\mu$m in thickness, can be prepared. This large and highquality single crystal of aluminum nitride is best suited as a substrate for the semiconductor device according to the present invention. In particular, the use of an oxide of a group IVa or Va element, especially a $TiO_2$ powder, as the oxide to be mixed with the AlN powder is preferred. In this case, a high-quality single crystal of aluminum nitride, wherein not less than 90% by mole of a total content of components other than nitrogen is accounted for by Al and the oxygen content is not more than 500 ppm, is particularly preferred as the substrate for the semiconductor device according to the present invention. Throughout the specification, the contents of the components constituting the aluminum nitride single crystal substrate are indicated based on a total content of the components other than nitrogen, unless otherwise specified.

The crystallinity of the above single crystal of aluminum nitride is preferably such that the half value width of a rocking curve obtained by X-ray diffractometry is 1.5 min or less. When use of a single crystal substrate having a half value width exceeding 1.5 min is likely to cause a deterioration in the service life of the semiconductor device. The thickness of aluminum nitride as the substrate is preferably not less than 300 $\mu$m. When the thickness is less than 300 $\mu$m, the crystallinity is likely to be lowered.

Preferably, the single crystal of aluminum nitride contains a transition metal in an amount of 10 ppb to not more than 0.1% by mole with the transition metal being preferably titanium. The transition metal is likely to bond to oxygen deteriorating the performance of the semiconductor device and serves to capture the oxygen impurities contained in a minute amount in the single crystal to reduce the diffusion of oxygen from the single crystal into the semiconductor device, preventing the deterioration of the performance of the semiconductor device. When the content of the transition metal is less than 10 ppb, the above effect cannot be attained. On the other hand, when it exceeds 0.1% by mole, the transition metal and its nitride and oxide and the like are precipitated as an undesired material, deteriorating the crystallinity of the single crystal of aluminum nitride.

For light emitting devices using a III-V nitride, especially LEDs and LDs, good crystallinity is required for improving the properties (such as emission intensity and service life) of these light emitting devices. It is known that the crystallinity of the single crystal film formed on the single crystal substrate becomes better as the lattice constant and the coefficient of thermal expansion of the single crystal substrate approach those of the single crystal film. Aluminum nitride used as the substrate in the present invention is a III-V nitride in itself. Therefore, the lattice constant and the coefficient of thermal expansion thereof are closer to those of the III-V nitride constituting the single crystal film than those of sapphire, silicon, SiC, and $MgAl_2O_4$.

Therefore, the III-V nitride film formed on the single crystal substrate of aluminum nitride has good crystallinity, and the light emitting device of the present invention produced by using this single crystal film has better properties than light emitting devices having conventional structures. Therefore, unlike the prior art wherein the provision of a low-temperature growth buffer layer is necessary and indispensable for forming a single crystal film of a III-V nitride having good crystallinity on a dissimilar substrate, the present invention does not necessarily require the provision of the buffer layer.

Among the light emitting devices, LD should have a mirror facet for a laser cavity in its structure. A high evenness is required of the mirror facet, and hence the creation of the mirror facet by cleavage is preferred. In the present invention, since a single crystal film of a III-V nitride is provided on a single crystal substrate of aluminum nitride, the single crystal film and the single crystal substrate are matched in crystal orientation and are coincident with each other in cleavage surface. Therefore, unlike conventional sapphire substrates and the like, the mirror facet can be easily formed by the cleavage of the single crystal substrate and the single crystal film.

In this case, the use of a substrate of a (0001), (10-10), or (11-20) plane as the single crystal substrate of aluminum nitride is preferred. In the case of the substrate of a (0001) plane, the formation of a mirror facet perpendicular to the substrate surface by utilizing the (10-10) or (11-20) plane as the cleavage surface facilitates the formation of the device. The formation of a mirror facet perpendicular to the substrate surface by utilizing the (0001) or (1-210) plane as the cleavage surface in the case of the substrate of the (10-10) plane and utilizing the (0001) or (1-100) plane as the cleavage surface in the case of the substrate of the (11-20) plane facilitates the formation of the device. When a substrate of plane orientation other than described above is used, the cleavage surface is inclined relative to the substrate, rendering the handling at the time of formation of the device difficult.

Among others, the substrate of a (10-10) plane or the substrate of a (11-20) plane is preferred. The reason for this is as follows. In the case of the substrate of a (0001) plane, since the cleavage surface is present for every 30° rotation, the cleavage surface is not always flat, making it difficult to form an even mirror facet, whereas in the case of the substrate of a (10-10) plane and the substrate of a (11-20) plane, the cleavage surface is present for every 90° rotation, and a flat mirror facet can be relatively easily formed.

Further, for light emitting devices using a III-V nitride, especially LEDs and LDs, and high-speed semiconductor devices, an increase in drive power is expected, and, also for high-temperature semiconductor devices, heat damage should be reduced. Therefore, a structure having good heat dissipation is particularly required. Aluminum nitride has much higher thermal conductivity than sapphire, $MgAl_2O_4$ and the like which have hitherto been used as the substrate and, hence, when the above semiconductor device is prepared using this material, offers good heat dissipation and can eliminate the need to provide a heat sink in addition to the substrate. Therefore, the use of the aluminum nitride substrate can contribute to a reduction in cost as compared with the use of the foregoing conventional substrate materials. In particular, since LDs using a III-V nitride are expected to have high oscillation threshold current and drive voltage and a very large calorific value, the structure of the present invention is very useful.

In the substrate of aluminum nitride used in the present invention, the roughness (in terms of Ra specified by Japanese Industrial Standard) of the surface on which a single crystal film of a III-V nitride is to be formed is preferably not more than 0.1 $\mu$m from the viewpoint of growing a singe crystal film of a III-V nitride having excellent crystallinity and surface smoothness of the film on the surface of the substrate.

The single crystal film of a III-V nitride grown on the single crystal substrate of aluminum nitride is a film of a III-V nitride having a wurtzite structure, and examples of such III-V nitrides include GaN, AlN, BN, InN, and single-crystalline alloys thereof, such as $Al_xGa_{(1-x)}N$, $In_xGa_{(1-x)}N$, $B_xGa_{(1-x)}N$, $B_xAl_{(1-x)}N$, $In_xAl_{(1-x)}N$, and $B_xIn_{(1-x)}N$. In the case of the single-crystalline alloys, in addition to the above three-component single-crystalline alloys, four-component and other multi-component sinale-crystalline alloys may be used.

Single crystal films of these III-V nitrides may be grown on the single crystal substrate of aluminum nitride by any conventional method for forming a single crystal film on a substrate, and examples of such methods include MBE (Molecular Beam Epitaxy method), MOCVD (Metal Organic Chemical Vapor Deposition method), sputtering, and vacuum deposition. In these methods, heating the substrate to a high temperature is necessary for the growth of a single crystal film. The substrate temperature at which the single crystal film can be grown varies depending upon the kind of the film to be grown and the film forming method. In the case of a single crystal of a III-V nitride, the substrate temperature is preferably between 500° C. and 1300° C.

As described above, a single crystal film of a III-V nitride can be grown on the substrate of aluminum nitride without interposition of any low-temperature growth buffer layer. However, the formation of a low-temperature growth buffer layer of a III-V nitride on the substrate followed by the formation of a single crystal film on the buffer layer is preferred from the viewpoint of growing a single crystal film of a III-V nitride having excellent crystallinity and smoothness of the film surface. When the low-temperature growth buffer layer is utilized, a III-V nitride having a wurtzite structure may be used as the buffer layer. In this case, preferably, the nitride has matched lattice. However, the material of the buffer layer is not limited to the material identical with the material of the single crystal film grown on the buffer layer.

The low-temperature growth buffer layer may be formed by the same method as described above in connection with the formation of the single crystal film of a III-V nitride. In this case, however, the substrate temperature should be below that for the formation of the single crystal film to grow an amorphous or polycrystalline film. The substrate temperature for the formation of the low-temperature buffer layer varies depending upon the kind of the film to be grown and the film forming method. In general, however, it is between 20° C. and 900° C. In this connection, it should be noted that the low-temperature growth buffer layer is amorphous or polycrystalline immediately after the formation thereof and, when the substrate temperature is raised to form a single crystal film on the buffer layer, is in many cases converted to a single crystal type.

In the case of a single crystal film of a III-V nitride in a semiconductor device, the electric conductivity is controlled by adding impurities. Specifically, in the single crystal film of a III-V nitride according to the present invention, as such impurities, at least one element selected from among silicon, tin, oxygen, sulfur, selenium, tellurium and the like may be added to impart n-type conductivity, while at least one element selected from among zinc, beryllium, magnesium, potassium and the like may be added to impart p-type conductivity. For the low-temperature growth buffer layer, as with the single crystal film of a III-V nitride, the electric conductivity may be controlled by adding impurities.

Figure 1:
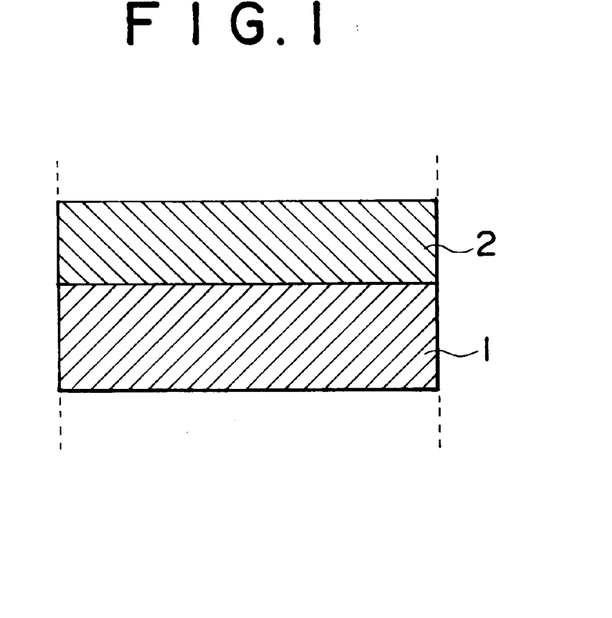
FIG. 1 is a schematic cross-sectional view of a principal part of the semiconductor device according to the present invention.

As shown in FIG. 1, the formation of a single crystal film 2 of a III-V nitride on a single crystal substrate 1 of aluminum nitride followed by the lamination of a single crystal film of a III-V nitride, with the band gap being varied by varying the material or the composition of the single-crystalline alloy, on the surface of the single crystal film 2 and the provision of predetermined electrodes can provide semiconductor devices of the present invention such as light emitting diodes and laser diodes.

EXAMPLE 1

At the outset, a single crystal of aluminum nitride as a substrate was prepared by the following procedure. An AlN powder having a purity of 99% and a $TiO_2$ powder having a purity of 99% were mixed together in a molar ratio of $TiO_2$ to AlN powder of 0.75. The mixture was then subjected to ultrasonic mixing in ethanol and then dried to remove ethanol, thereby preparing a mixed powder. Separately, a c-plane-cut, β-type SiC single crystal plate having a size of 10 mm square was provided as a substrate for crystal growth.

Figure 2:
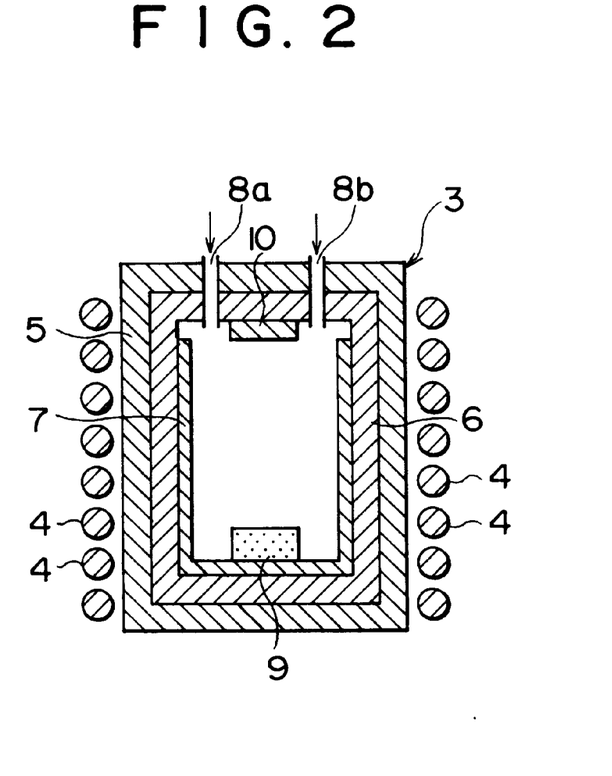
FIG. 2 is a schematic cross-sectional view of a heating furnace used in the preparation of the single crystal substrate of aluminum nitride in Example 1.

The mixed powder and the single crystal plate of SiC were placed in a heating furnace as shown in FIG. 2. Specifically, a heating furnace 3 is provided with an induction heating coil 4 and a heat insulator muffle 5, and a vessel-like lidded graphite crucible 6 is provided on the inside of the heat insulator muffle 5, while a non-lidded BN crucible 7 is placed on the inside of the graphite crucible 6. An inlet 8a and an outlet 8b for an atmospheric gas are provided at the top of the heating furnace 3. The mixed powder 9 after compression molding was placed within the BN crucible 7 in the heating furnace 3, and the single crystal plate of SiC as a substrate 10 was set above so as to face the mixed powder 9.

The interior of the heating furnace 3 was once evacuated, and a nitrogen gas was introduced through the inlet 8a into the furnace 3 to bring the pressure within the furnace 3 to 1 atm (760 Torr). Then, the temperature around the mixed powder 9 was heated by induction heating to 1800° C., a temperature below the decomposition temperature of AlN (2200° C.), while the temperature around the substrate 10 was heated to 1700° C. by controlling the heating section. The system was held in this state for 24 hr. In this case, the components of the vapor phase within the heating furnace 3 were analyzed by spectroscopy. As a result, it was found that the partial pressure of oxygen was 0.05 Torr with the ratio of the partial pressure of carbon (Pr) to the partial pressure of oxygen (Po), Pr/Po, being 2.0.

As a result, it was found that a transparent amber-colored aluminum nitride having a size of 10 mm square and a thickness of 8200 μm was grown on the lower surface of the substrate 10 constructed of a single crystal plate of SiC. The aluminum nitride was then analyzed for the crystal structure by X ray diffractometry. As a result, it was confirmed that the grown aluminum nitride was of single crystal type. Further, the composition of the crystal was analyzed. As a result, it was found that the aluminum content was 92% by mole, the oxygen content was 350 ppm, the carbon content was 8 mol %, and the titanium content was 0.02 mol %.

Figure 3:
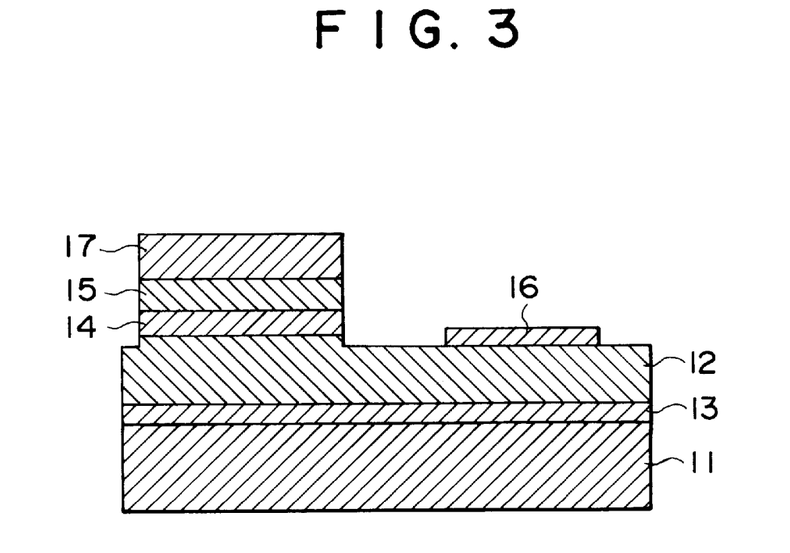
FIG. 3 is a schematic cross-sectional view of the structure of the light emitting diode prepared in Example 1.

The single crystal of aluminum nitride thus obtained was ground to give an even surface and washed with an organic solvent, and the (0001) plane thereof was used as a substrate to form a light emitting diode (LED) with an active layer of $In_{0.1}Ga_{0.9}N$. The structure of this light emitting diode is shown in FIG. 3. Specifically, a light emitting diode (LED) with an active layer of $In_{0.1}Ga_{0.9}N$ was prepared by using the above aluminum nitride substrate 11, forming a single crystal film 12 of n-type GaN on the surface of the aluminum nitride substrate 11 through a low-temperature growth buffer layer 13 of n-type GaN, forming a single crystal film 14 of n-type $In_{0.1}Ga_{0.9}N$ and a single crystal film 15 of p-type GaN thereon in that order, and forming electrodes 16 and 17.

The single crystal film of each III-V nitride was grown by the MOCVD under atmospheric pressure according to the following procedure. At the outset, the low-temperature growth buffer layer 13 of n-type GaN was formed as follows. Hydrogen was introduced as a carrier gas into the reaction chamber at a flow rate of 10 liter/min together with $NH_3$, trimethylgallium, and $SiH_4$ (diluted with $H_2$ to a concentration of 10 ppm) as the source gases respectively at flow rates of 4.0 liter/min, 30 μmol/min, and 4 nmol/min, and the system was kept in this state at a substrate temperature of 500° C. for one min. Thus, a low-temperature buffer layer 13 of n-type GaN was grown with a thickness of 25 nm on the single crystal substrate 11 of aluminum nitride. Thereafter, the temperature of the substrate was raised to 1000° C. while keeping the above gas introduction conditions, and a single crystal film 12 of n-type GaN was grown in this state on the low-temperature buffer layer 13 to a thickness of 4 μm over a period of 60 min.

Subsequently, the temperature of the substrate was brought to 800° C., and a hydrogen gas was introduced as a carrier gas into the reaction chamber at a flow rate of 10 liter/min together with $NH_3$, trimethylindium, trimethylgallium, and $SiH_4$ (diluted with $H_2$ to a concentration of 10 ppm) as the source gases, respectively, at flow rates of 4.0 liter/min, 24 μmol/min, 2 μmol/min, and 1 nmol/min. A single crystal film 14 of n-type $In_{0.1}Ga_{0.9}N$ was grown on the single crystal film 12 of n-type GaN to a thickness of 20 nm over a period of 7 min. The temperature of the substrate was again raised to 1000° C., and a single crystal film 15 of p-type GaN was grown on the single crystal film 14 of n-type $In_{0.1}Ga_{0.9}N$ to a thickness of 0.8 μm over a period of 15 min. In this case, the gases used were the same as those used in the growth of the single crystal film 12 of n-type GaN, except that biscyclopentadiethylmagnesium was used instead of $SiH_4$ at a flow rate of 3.6 μmol/min.

After the growth of the single crystal films, the whole substrate with the single crystal films grown thereon was annealed in a nitrogen atmosphere at 700° C. Thereafter, each of the single crystal nitride films was partially processed by reactive dry etching to expose part of the single crystal layer 12 of n-type GaN on the surface. Finally, aluminum electrodes 16 and 17 were formed by sputtering respectively on the single crystal film 15 of p-type GaN as the uppermost layer and the exposed single crystal film 12 of n-type GaN to prepare the LED.

Samples extracted in the course of respective steps were provided, and the crystal structures thereof were examined by RHEED (reflection high-energy electron diffraction). As a result, it was found that each of the single crystal film 12 of n-type GaN, the single crystal film 14 of n-type $In_{0.1}Ga_{0.9}N$, and the single crystal film 15 of p-type GaN was a single crystal film having a wurtzite structure, and that the (0001) plane of the single crystal film was grown in parallel with the (0001) plane of the single crystal substrate 11 of aluminum nitride.

The LED thus obtained was evaluated for the properties thereof at room temperature. As a result, a blue light emission having a peak wavelength at 440 nm was confirmed. Continuous light emission of the LED for 1 hr neither caused such a large temperature rise of the device as will influence the performance of the device nor resulted in a deterioration in the properties such as brightness.

EXAMPLE 2

Figure 4:
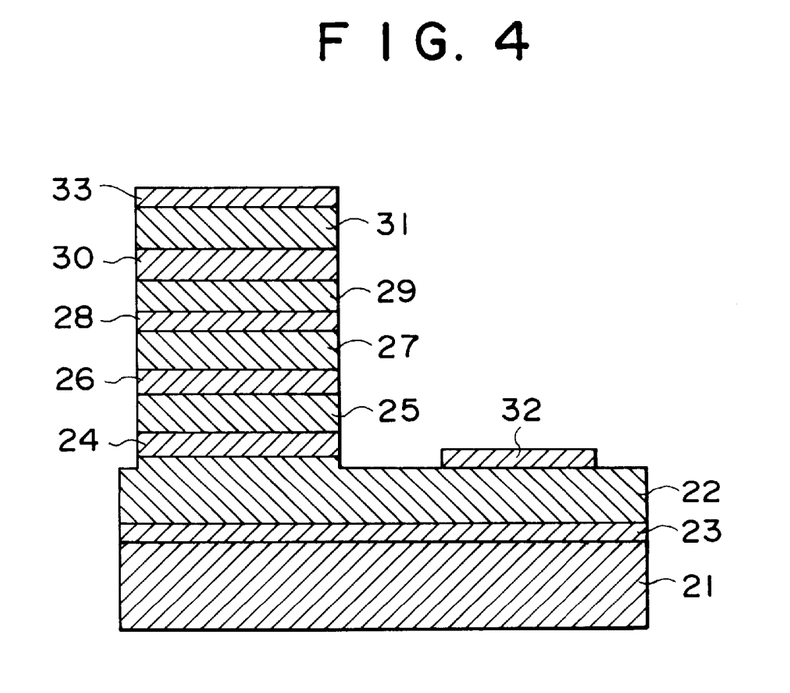
FIG. 4 is a schematic cross-sectional view of he structure of the laser diode prepared in Example 2.

The (0001) plane of the same single crystal of aluminum nitride as used in Example 1 was used as a substrate to prepare a laser diode (LD), with a structure shown in FIG. 4, having a quantum well structure 27 of $In_{0.2}Ga_{0.8}N$/$In_{0.05}Ga_{0.95}N$ as an active layer.

Specifically, as shown in FIG. 4, a low-temperature growth buffer layer 23 of n-type GaN was formed on the surface of the substrate 21 of aluminum nitride, and subsequently a single crystal film 22 of n-type GaN, a single crystal film 24 of n-type $In_{0.1}Ga_{0.9}N$, a single crystal film 25 of n-type $Al_{0.15}Ga_{0.85}N$, a single crystal film 26 of n-type GaN, a quantum-well structure 27 of $In_{0.2}Ga_{0.8}N$/$In_{0.05}Ga_{0.95}N$, a single crystal film 28 of p-type $Al_{0.2}Ga_{0.8}N$, a single crystal film 29 of p-type GaN, a single crystal film 30 of p-type $Al_{0.15}Ga_{0.85}N$, and a single crystal film 31 of p-type GaN were formed thereon in that order, followed by the formation of electrodes 32 and 33 to prepare the LD.

The single crystal film of each of the above III-V nitrides was grown by the MOCVD under atmospheric pressure according to the following procedure. At the outset, the low-temperature growth buffer layer 23 of n-type GaN was grown on the single crystal substrate 21 of aluminum nitride at a substrate temperature of 500° C. In this case, hydrogen was introduced as a carrier gas into the reaction chamber at a flow rate of 10 liter/min together with $NH_3$, trimethylgallium, and $SiH_4$ (diluted with $H_2$ to a concentration of 10 ppm) as the source gases, respectively, at flow rates of 4.0 liter/min, 30 μmol/min, and 4 nmol/min to grow the low-temperature growth buffer layer 23 of n-type GaN to a thickness of 25 nm.

Thereafter, the temperature of the substrate was raised to 1000° C. while keeping the above gas introduction conditions, and a single crystal film 22 of n-type GaN was grown in this state on the low-temperature buffer layer 23 of n-type GaN to a thickness of 4 μm over a period of 60 min. Hydrogen gas was then introduced as a carrier gas into the reaction chamber at a flow rate of 10 liter/min together with NH$_3$, trimethylindium, trimethylgallium, and SiH$_4$ (diluted with H$_2$ to a concentration of 10 ppm) as the source gases, respectively, at flow rates of 4.0 liter/min, 24 µmol/min, 2 µmol/min, and 1 nmol/min to grow the single crystal film 24 of n-type In$_{0.1}$Ga$_{0.9}$N on the single crystal film 22 of n-type GaN to a thickness of 100 nm over a period of 35 min.

The temperature of the substrate was again raised to 1000° C., and a single crystal film 25 of n-type Al$_{0.15}$Ga$_{0.85}$N was grown. Specifically, NH$_3$, trimethylaluminum, trimethylgallium, and SiH$_4$ (diluted with H$_2$ to a concentration of 10 ppm) were used as the source gases, respectively, at flow rates of 4.0 liter/min, 6 µmol/min, 24 µmol/min, and 4 nmol/min to grow the single crystal film of n-type Al$_{0.15}$Ga$_{0.85}$N to a thickness of 400 nm over a period of 5 min. A single crystal film 26 of n-type GaN was then grown on the single crystal film 25 of n-type Al$_{0.15}$Ga$_{0.85}$N. In this case, the gases used were the same as those used in the growth of the single crystal film 22 of n-type GaN, and the single crystal film 26 of n-type GaN was grown to a thickness of 100 nm over a period of 2 min.

Further, In$_{0.2}$Ga$_{0.8}$N and In$_{0.05}$Ga$_{0.95}$N were laminated on the single crystal film 26 of n-type GaN in respective thicknesses of 2.5 nm and 5.0 nm to form a quantum well structure 27 of 26 periods. In this case, for the formation of the In$_{0.2}$Ga$_{0.8}$N layer, a hydrogen gas was used as a carrier gas at a flow rate of 10 liter/min together with NH$_3$, trimethylgallium, and trimethylindium as the source gases, respectively, at flow rates of 4.0 liter/min, 1 µmol/min, and 24 mol/min. On the other hand, for the growth of the In$_{0.05}$Ga$_{0.95}$N layer, a hydrogen gas was used as a carrier gas at a flow rate of 10 liter/min together with NH$_3$, trimethylgallium, and trimethylindium as the source gases, respectively, at flow rates of 4.0 liter/min, 1 µmol/min, and 1.2 µmol/min.

Subsequently, a single crystal film 28 of p-type Al$_{0.2}$Ga$_{0.8}$N was grown. NH$_3$, trimethylaluminum, trimethylgallium, and biscyclopentadiethylmagnesium were used as the source gases, respectively, at flow rates of 4.0 liter/min, 10 µmol/min, 24 µmol/min, and 3.6 µmol/min to grow the single crystal film 28 of p-type Al$_{0.2}$Ga$_{0.8}$N to a thickness of 200 nm over a period of 4 min. A single crystal film 29 of p-type GaN was grown on the single crystal film 28 of p-type Al$_{0.2}$Ga$_{0.8}$N. In this case, the gases used for growth were the same as those used in the growth of the single crystal film 22 of n-type GaN, except that biscyclopentadiethylmagnesium was used instead of SiH$_4$ (diluted with H$_2$ to a concentration of 10 ppm) at a flow rate of 3.6 µmol/min. Thus, the single crystal film 29 was grown to a thickness of 100 nm.

Further, a single crystal film 30 of p-type Al$_{0.15}$Ga$_{0.85}$N was grown on the single crystal film 29 of p-type GaN. The source gases used for the growth were the same as those used in the growth of the single crystal film 25 of n-type Al$_{0.15}$Ga$_{0.85}$N, except that biscyclopentadiethylmagnesium was used instead of SiH$_4$ (diluted with H$_2$ to a concentration of 10 ppm) at a flow rate of 3.6 µmol/min. Thus, the single crystal film 30 was grown to a thickness of 400 nm over a period of 8 min. Thereafter, a single crystal film 31 of p-type GaN was grown thereon to a thickness of 500 nm in the same manner as in the formation of the single crystal film 29 of p-type GaN.

After the growth of the above single crystal films, the whole laminate was annealed in a nitrogen atmosphere at 700° C. Thereafter, each of the single crystal nitride films was partially processed by reactive dry etching to expose part of the lower single crystal layer 22 of n-type GaN to the surface. The (10-10) plane of the single crystal substrate 21 of aluminum nitride was cleaved to form a laser cavity. Aluminum electrodes 32 and 33 were then formed by sputtering respectively on the single crystal film 31 of p-type GaN as the uppermost layer and the exposed single crystal film 22 of n-type GaN to the prepare the LD.

Samples extracted in the course of respective steps were provided, and the crystal structures thereof were examined by the RHEED. As a result, it was found that each of the layers was a single crystal film having a wurtzite structure, and the (0001) plane of the single crystal film was grown in parallel with the (0001) plane of the single crystal substrate 21 of aluminum nitride.

The LED thus obtained was evaluated for the properties thereof at room temperature. As a result, the emission of laser beams having a peak wavelength at 420 nm and a half value width of 0.9 nm was confirmed. Continuous light emission of the LED for 1 hr neither caused such a large temperature rise of the device as will influence the performance of the device nor resulted in a deterioration in the properties such as brightness.

EXAMPLE 3

Figure 5:
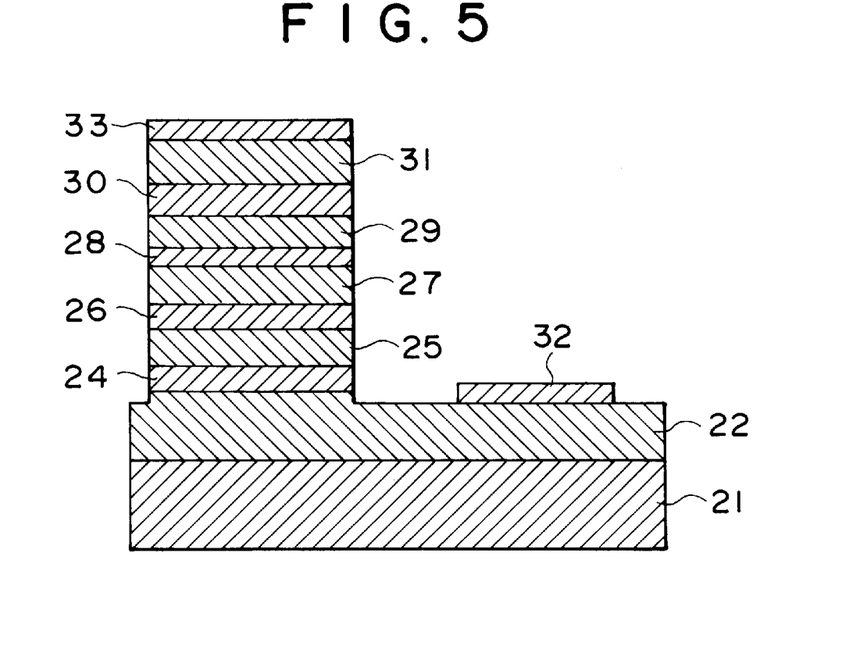
FIG. 5 is a schematic cross-sectional view of the structure of the laser diode prepared in Example 3.

An LD having a structure shown in FIG. 5 was prepared in the same manner as in Example 2. except that the low-temperature growth buffer layer 23 shown in FIG. 4 was not formed. The LD shown in FIG. 5 has the same structure as that shown in FIG. 4 in Example 2, except that the low-temperature growth buffer layer 23 is absent.

The properties of this LD having the structure shown in FIG. 5 were evaluated at room temperature. As a result, the emission of laser beams having a peak wavelength at 420 nm and a half value width of 1.0 nm was confirmed. Continuous light emission of the LED for 1 hr neither caused such a large temperature rise of the device as will influence the performance of the device nor resulted in a deterioration in the properties such as brightness. These results show that there is no significant difference in practical performance of the LD between the provision of no low-temperature growth buffer layer and the provision of the low-temperature growth buffer layer in Example 2.

Comparative Example 1

Figure 6:
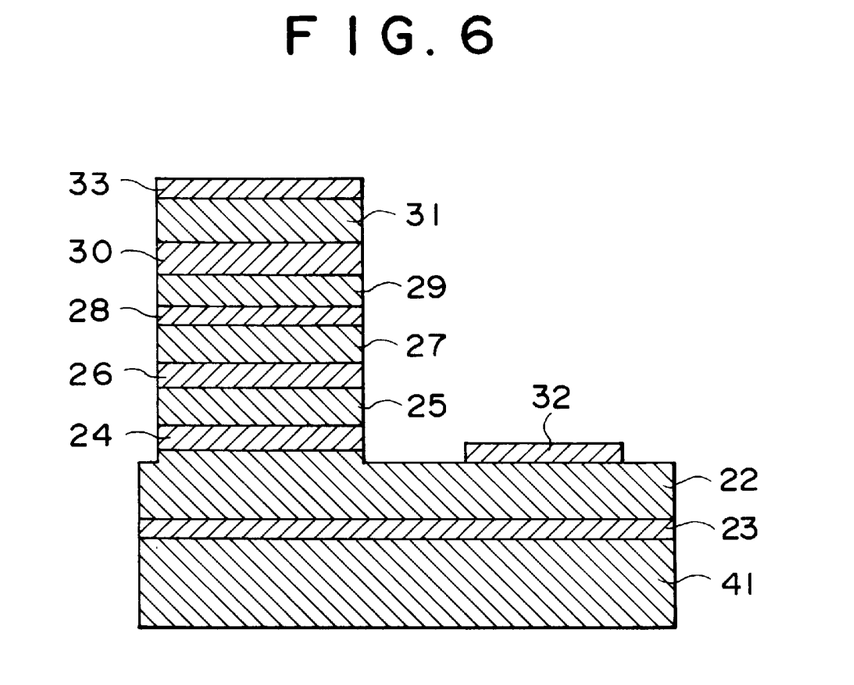
FIG. 6 is a schematic cross-sectional view of the structure of the laser diode prepared in Comparative Example 1.

As shown in FIG. 6, an LD was formed in the same manner as in Example 2. except that a sapphire single crystal substrate 41 constituted of the (0001) plane face of a sapphire single crystal was used and the laser cavity was formed by dry etching. Specifically, the LD shown in FIG. 6 has the same structure as that shown in FIG. 4 in Example 2, except that these LDs are different from each other in the material of the substrate and the method for forming the laser cavity.

The LD thus obtained was evaluated for the properties thereof at room temperature. As a result, the emission of laser beams having a peak wavelength at 420 nm and a half value width of 1.8 nm was confirmed. However, continuous light emission of the LD for 10 min resulted in distinctly lowered luminance.

EXAMPLE 4

The (10-10) plane of a single crystal of aluminum nitride was synthesized in the same manner as in Example 1. except that the (10-10) plane of 6H-SiC was used as the single crystal substrate of SiC in the synthesis of the single crystal of aluminum nitride as the substrate. The LD shown in FIG.

4 was prepared in the same manner as in Example 2, except that this (10-10) plane of the single crystal of aluminum nitride was used as the substrate and the (0001) plane was cleaved.

The LD thus obtained was evaluated for the properties thereof at room temperature. As a result, the emission of laser beams having a peak wavelength at 420 nm and a half value width of 0.6 nm was confirmed. This shows that an LD having a narrower half value width in the emission spectrum can be formed by using the (10-10) plane as the single crystal substrate of aluminum nitride and constructing a laser cavity by the cleavage of the (0001) plane and the use of the (0001) plane in the formation of the laser cavity is preferred.

EXAMPLE 5

The (0001) planes of single crystals of aluminum nitride were synthesized in the same manner as in Example 1, except that, in the synthesis of the single crystal of aluminum nitride as the substrate, the (0001) plane of 6H-SiC was used as the single crystal substrate of SiC and the time for the growth of the single crystals of aluminum nitride was 50 min and 1 hr. The single crystals of aluminum nitride thus obtained, respectively, had thicknesses of 290 μm and 340 μm, and half value widths of 1.7 min and 1.2 min in terms of the half value width of a rocking curve regarding the (0002) plane measured according to the four-crystal method utilizing a gallium (110) plane by means of Cu Kα radiation.

The LDs each having a structure shown in FIG. 4 were prepared in the same manner as in Example 2, except that the (0001) plane of each of the single crystals of aluminum nitride different from each other in thickness was used as the substrate. The LDs thus obtained were evaluated for the properties thereof at room temperature. As a result, the emission of laser beams each having a peak wavelength at 420 nm and having respective half value widths of 1.6 nm and 1.5 nm was confirmed. After light emission for 24 hr, the half-value widths were measured again and found to be 1.8 nm and 1.5 nm, respectively.

These results show that the LD using a single crystal substrate of aluminum nitride having a half value width of the rocking curve exceeding 1.5 min (thickness: 290 μm) exhibits a large half value width in an emission spectrum and is likely to cause a change in light emitting properties with the elapse of time, indicating that the half value width of the rocking curve for the single crystal substrate is preferably not more than 1.5 min. It was also found that the use of a single crystal substrate of aluminum nitride having a thickness of not less than 300 μm results in the formation of a single crystal film having good crystallinity.

EXAMPLE 6

The (0001) planes of single crystals of aluminum nitride were synthesized in the same manner as in Example 1, except that, in the synthesis of the single crystal of aluminum nitride as the substrate, the molar ratio of $TiO_2$ to AlN in the mixed powder was changed to 0.001, 0.2, and 10, that the (0001) plane of 6H-SiC was used as the single crystal substrate of SiC, and that the temperature around the mixed powder was 1900° C. The titanium contents of the single crystals thus obtained were respectively 8 ppb, 0.06% by mole, and 0.15% by mole of a total content of the components other than nitrogen.

LDs each having a structure shown in FIG. 4 were prepared in the same manner as in Example 2, except that the (0001) plane of each of the single crystals of aluminum nitride different from each other in titanium content was used as the substrate. The LDs thus obtained were evaluated for the properties thereof at room temperature. As a result, the emission of laser beams each having a peak wavelength at 420 nm and having respective half value widths of 0.8 nm, 1.0 nm, and 1.9 nm was confirmed. After light emission for 24 hr, the half value widths were measured again and found to be 1.5 nm, 1.0 nm, and 1.9 nm, respectively.

These results show that the LD formed on the single crystal substrates of aluminum nitride having a content of titanium as a transition metal of less than 10 ppb exhibits a change in light emitting properties with the elapse of time, while the LD formed on the single crystal substrate of aluminum nitride having a content of titanium as a transition metal exceeding 0.1% by mole exhibits a wide half value width in an emission spectrum from the first, indicating that the content of titanium as a transition metal in the single crystal substrate of aluminum nitride is preferably in the range of from 10 ppb to 0.1% by mole.

EXAMPLE 7

Figure 7:
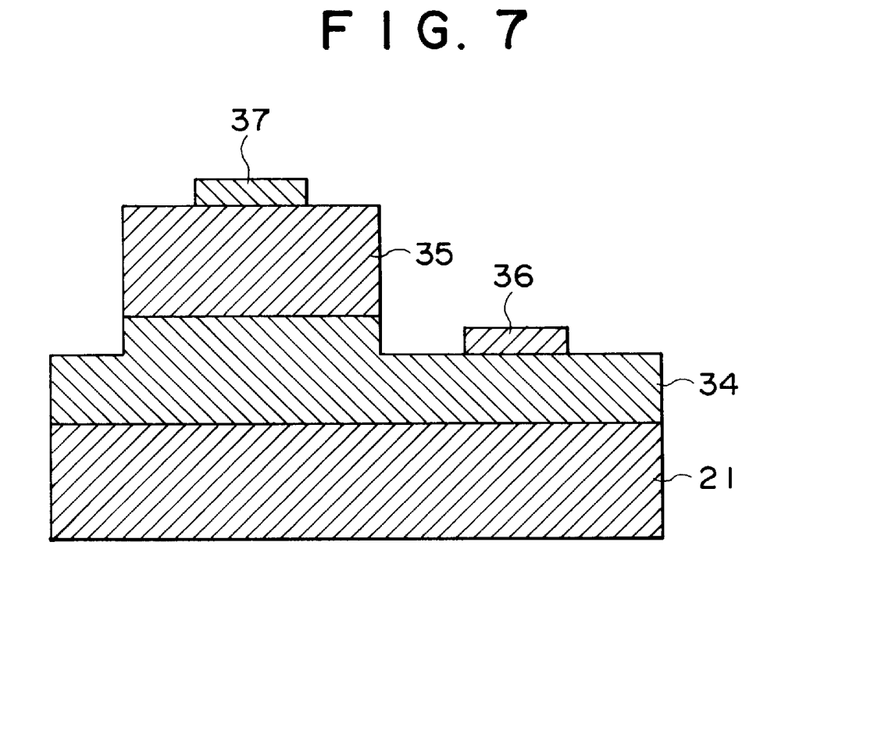
FIG. 7 is a schematic cross-sectional view of the structure of the diode prepared in Example 7.

A p-n junction diode of $Al_{0.5}Ga_{0.5}N$ having a structure shown in FIG. 7 was formed using, as a substrate, the (0001) plane of the same single crystal of aluminum nitride as used in Example 1. Specifically, as shown in FIG. 7, a single crystal film 34 of n-type $Al_{0.5}Ga_{0.5}N$ was formed on the surface of the single crystal substrate 21 of aluminum nitride, and a single crystal film 35 of p-type $Al_{0.5}Ga_{0.5}N$ was formed thereon, followed by provision of electrodes 36 and 37 to prepare a diode.

The single crystal film of each of the above III-V nitrides was grown by the MOCVD under atmospheric pressure according to the following procedure. At the outset, the single crystal film 34 of n-type $Al_{0.5}Ga_{0.5}N$ was grown on the single crystal substrate 21 of aluminum nitride at a substrate temperature of 1000° C. In this case, hydrogen was introduced as a carrier gas into the reaction chamber at a flow rate of 10 liter/min together with $NH_3$, trimethylaluminum, trimethylgallium, and $SiH_4$ (diluted with $H_2$ to a concentration of 10 ppm) as the source gases, respectively, at flow rates of 4.0 liter/min, 10 μmol/min, 16 μmol/min, and 4 nmol/min to grow the single crystal film 34 of n-type $Al_{0.5}Ga_{0.5}N$ to a thickness of 300 nm over a period of 3 min.

A single crystal film 35 of p-type $Al_{0.5}Ga_{0.5}N$ was grown while keeping the substrate temperature at 1000° C. In this case, $NH_3$, trimethylammonium, trimethylgallium, and bis-cyclopentadiethylmagnesium were used as the source gasses at respective flow rates of 4.0 liter/min, 10 μmol/min, 15 μmol/min, and 3.6 nmol/min to grow the single crystal film 35 of p-type $Al_{0.5}Ga_{0.5}N$ to a thickness of 320 nm over a period of 4 min.

After the growth of the single crystal films 34 and 35, each of the single crystal films 34 and 35 was partially processed by reactive dry etching to expose part of the lower single crystal film 34 of n-type $Al_{0.5}Ga_{0.5}N$ on the surface. Thereafter, titanium electrodes 36 and 37 were formed by sputtering respectively on the exposed single crystal film 34 of n-type $Al_{0.5}Ga_{0.5}N$ and the single crystal film 35 of p-type $Al_{0.5}Ga_{0.5}N$ as the uppermost layer by sputtering to prepare a diode.

The electric characteristics of the diode thus obtained were evaluated. As a result, it was found that the diode has good rectification characteristics at room temperature and functions as a diode. Further, the temperature was raised to 200° C., and the same performance test was carried out. As a result, rectification characteristics were confirmed, indicating that the diode functions as a diode even at a high temperature. These results show that the single crystal substrate of aluminum nitride is suitable also for the construction of a p-n junction diode.

Comparative Example 2

Figure 8:
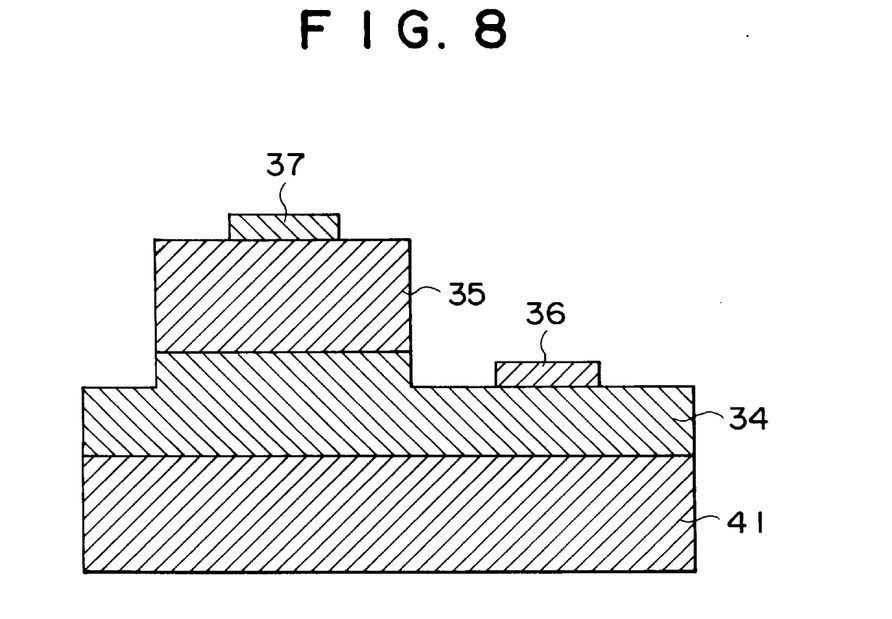
FIG. 8 is a schematic cross-sectional view of the structure of the diode prepared in Comparative Example 2.

A diode was formed in the same manner as in Example 7, except that, as shown in FIG. 8, a single crystal substrate 41 constituted of the (0001) plane of a sapphire single crystal was used. Specifically, the diode shown in FIG. 8 has the same structure as the diode shown in FIG. 7 in Example 7, except that these diodes are different from each other in the material of the substrate.

The electric characteristics of the diode thus obtained were evaluated. As a result, it was found that the diode has rectification characteristics at room temperature and functions as a diode. Further, the temperature was raised to 200° C., and the same performance test was carried out. As a result, no rectification characteristics could be confirmed.

According to the present invention, the use of a large single crystal substrate of aluminum nitride which is matched in lattice constant and coefficient of thermal expansion with a III-V nitride and has a cleavage surface and good heat dissipation, permits a single crystal film of a III-V nitride having good crystallinity to be grown on the substrate, thus making it possible to provide semiconductor devices using a III-V nitride, for example, short-wavelength light emitting devices capable of conducting continuous oscillation, light receiving devices, high-temperature semiconductor devices, and high-speed semiconductor devices.

Further, the present invention can eliminate the need to provide any low-temperature growth buffer layer which has been required in the art. In addition, the invention provides semiconductor devices having heat dissipation good enough to eliminate the need to mount any heat sink, thus realizing light emitting devices such as light emitting diodes and laser diodes particularly using a III-V nitride. In the case of a laser diode, this enables a laser cavity to be prepared by taking advantage of cleavage of the substrate.

What is claimed is:

1. A semiconductor device comprising a single crystal substrate of aluminum nitride and a single crystal film of at least one III-V nitride provided on the substrate, said at least one III-V nitride being selected from the group consisting of gallium nitride, aluminum nitride, boron nitride, indium nitride, and single-crystalline alloys of said compounds, wherein the half value width of a rocking curve obtained by X-ray diffractometry of the single crystal substrate of aluminum nitride is 1.5 min or less.

2. The semiconductor device according to claim 1, wherein said single crystal film is directly provided on the single crystal substrate of aluminum nitride.

3. The semiconductor device according to claim 1, wherein said single crystal film is provided on the single crystal substrate of aluminum nitride through a low-temperature growth buffer layer formed of at least one III-V nitride selected from the group consisting of gallium nitride, aluminum nitride, boron nitride, indium nitride, and single-crystalline alloys of said compounds.

4. The semiconductor device according to claim 1, wherein the semiconductor device is a light emitting diode or a laser diode.

5. The semiconductor device according to claim 4, wherein the laser diode has a laser cavity formed by the cleavage of the single crystal of aluminum nitride and the single crystal film of a III-V nitride.

6. The semiconductor device according to claim 5, wherein the single crystal substrate of aluminum nitride constituting the laser diode has a (0001) plane orientation.

7. The semiconductor device according to claim 5, wherein the single crystal substrate of aluminum nitride constituting the laser diode has a (10-10) or (11-20) plane orientation.

8. The semiconductor device according to claim 4, wherein the single crystal substrate of aluminum nitride constituting the laser diode has a (0001) plane orientation.

9. The semiconductor device according to claim 4, wherein the single crystal substrate of aluminum nitride constituting the laser diode has a (10-10) or (11-20) plane orientation.

10. A semiconductor device comprising a single crystal substrate of aluminum nitride and a single crystal film of at least one III-V nitride provided on the substrate, said at least one III-V nitride being selected from the group consisting of gallium nitride, aluminum nitride, boron nitride, indium nitride, and single-crystalline alloys of said compounds, wherein the single crystal substrate of aluminum nitride has a thickness of not less than 300 $\mu$m.

11. The semiconductor device according to claim 10, wherein said single crystal film is directly provided on the single crystal substrate of aluminum nitride.

12. The semiconductor device according to claim 10, wherein said single crystal film is provided on the single crystal substrate of aluminum nitride through a low-temperature growth buffer layer formed of at least one III-V nitride selected from the group consisting of gallium nitride, aluminum nitride, boron nitride, indium nitride, and single-crystalline alloys of said compounds.

13. The semiconductor device according to claim 10, wherein the semiconductor device is a light emitting diode or a laser diode.

14. The semiconductor device according to claim 13, wherein the laser diode has a laser cavity formed by the cleavage of the single crystal of aluminum nitride and the single crystal film of a III-V nitride.

15. The semiconductor device according to claim 14, wherein the single crystal substrate of aluminum nitride constituting the laser diode has a (0001) plane orientation.

16. The semiconductor device according to claim 14, wherein the single crystal substrate of aluminum nitride constituting the laser diode has a (10-10) or (11-20) plane orientation.

17. The semiconductor device according to claim 13, wherein the single crystal substrate of aluminum nitride constituting the laser diode has a (0001) plane orientation.

18. The semiconductor device according to claim 13, wherein the single crystal substrate of aluminum nitride constituting the laser diode has a (10-10) or (11-20) plane orientation.

19. A semiconductor device comprising a single crystal substrate of aluminum nitride and a single crystal film of at least one III-V nitride provided on the substrate, said at least one III-V nitride being selected from the group consisting of gallium nitride, aluminum nitride, boron nitride, indium nitride, and single-crystalline alloys of said compounds, wherein the single crystal substrate of aluminum nitride contains a transition metal in an amount of 10 ppb to 0.1% by mol.

20. The semiconductor device according to claim 19, wherein the transition metal is titanium.

21. The semiconductor device according to claim 19, wherein said single crystal film is directly provided on the single crystal substrate of aluminum nitride.

22. The semiconductor device according to claim 19, wherein said single crystal film is provided on the single crystal substrate of aluminum nitride through a low-temperature growth buffer layer formed of at least one III-V nitride selected from the group consisting of gallium nitride, aluminum nitride, boron nitride, indium nitride, and single-crystalline alloys of said compounds.

23. The semiconductor device according to claim 19, wherein the semiconductor device is a light emitting diode or a laser diode.

24. The semiconductor device according to claim 23, wherein the laser diode has a laser cavity formed by the cleavage of the single crystal of aluminum nitride and the single crystal film of a III-V nitride.

25. The semiconductor device according to claim 24, wherein the single crystal substrate of aluminum nitride constituting the laser diode has a (0001) plane orientation.

26. The semiconductor device according to claim 24, wherein the single crystal substrate of aluminum nitride constituting the laser diode has a (10-10) or (11-20) plane orientation.

27. The semiconductor device according to claim 23, wherein the single crystal substrate of aluminum nitride constituting the laser diode has a (0001) plane orientation.

28. The semiconductor device according to claim 23, wherein the single crystal substrate of aluminum nitride constituting the laser diode has a (10-10) or (11-20) plane orientation.

* * * * *